United States Patent
Plahn et al.

(10) Patent No.: US 9,214,899 B2
(45) Date of Patent: Dec. 15, 2015

(54) POWER AMPLIFIER ASSEMBLY COMPRISING SUSPENDED STRIP LINES

(75) Inventors: Joakim Plahn, Taby (SE); Andrzej Sawicki, Sollentuna (SE); Martin Schoon, Solna (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 35 days.

(21) Appl. No.: 14/124,858

(22) PCT Filed: Jun. 7, 2011

(86) PCT No.: PCT/SE2011/050698
§ 371 (c)(1),
(2), (4) Date: Dec. 9, 2013

(87) PCT Pub. No.: WO2012/169944
PCT Pub. Date: Dec. 13, 2012

(65) Prior Publication Data
US 2014/0103997 A1    Apr. 17, 2014

(51) Int. Cl.
| | |
|---|---|
| *H03F 3/189* | (2006.01) |
| *H03F 3/60* | (2006.01) |
| *H03F 3/20* | (2006.01) |
| *H01P 5/12* | (2006.01) |
| *H01P 3/08* | (2006.01) |
| *H05K 1/02* | (2006.01) |

(52) U.S. Cl.
CPC ............... *H03F 3/189* (2013.01); *H01P 3/087* (2013.01); *H03F 3/20* (2013.01); *H03F 3/602* (2013.01); *H01P 3/088* (2013.01); *H01P 5/12* (2013.01); *H05K 1/02* (2013.01)

(58) Field of Classification Search
CPC ............. H03F 3/60; H03F 3/602; H03F 3/08; H03F 3/20; H01P 3/087; H01P 5/12; H05K 1/02

USPC .............. 330/65, 66, 68, 53; 361/748; 334/85; 439/55; 455/150.1, 154.1
See application file for complete search history.

(56) References Cited

U.S. PATENT DOCUMENTS

| | | | |
|---|---|---|---|
| 5,012,209 A | 4/1991 | Lantagne et al. | |
| 5,164,689 A * | 11/1992 | Plonka | 333/128 |

(Continued)

FOREIGN PATENT DOCUMENTS

| | | |
|---|---|---|
| EP | 0 508 662 A2 | 10/1992 |
| JP | 61 184901 A | 8/1986 |

OTHER PUBLICATIONS

Peter et al. "High-Performance HEMT Amplifiers with a Simple Low-Loss Matching Network" IEEE Transactions on Microwave Theory and Techniques, vol. 39, No. 9, 1991, pp. 1673-1675.

*Primary Examiner* — Steven J Mottola
*Assistant Examiner* — Hafizur Rahman
(74) *Attorney, Agent, or Firm* — Rothwell, Figg, Ernst & Manbeck, P.C.

(57) ABSTRACT

It is presented a power amplifier assembly comprising; a radio frequency multi-order power amplifier comprising a circuit board; a grounding structure connected to the radio frequency multi-order power amplifier and comprising a recess; a combining network connected to a plurality of outputs of the radio frequency multi-order power amplifier. The combining network comprises: a plurality of input connection points, wherein each of the plurality of input connection points is connected to a respective output of the plurality of outputs of the radio frequency multi-order power amplifier; an output connection point; and a conductor arrangement comprising a plurality of conductive paths arranged between the plurality of input connection points and the output connection point; wherein at least one of the plurality of conductive paths is at least partly formed by a suspended conductor positioned in the recess of the grounding structure.

11 Claims, 5 Drawing Sheets

(56) References Cited

U.S. PATENT DOCUMENTS

| | | | |
|---|---|---|---|
| 5,903,854 A * | 5/1999 | Abe et al. | 455/575.1 |
| 6,160,454 A * | 12/2000 | Buer et al. | 330/295 |
| 6,518,844 B1 * | 2/2003 | Sherman et al. | 330/286 |
| 6,542,035 B2 * | 4/2003 | Cook et al. | 330/286 |
| 7,683,734 B2 * | 3/2010 | Catoiu | 333/115 |
| 2004/0048420 A1 | 3/2004 | Miller | |
| 2010/0157547 A1 * | 6/2010 | Shen et al. | 361/748 |

* cited by examiner

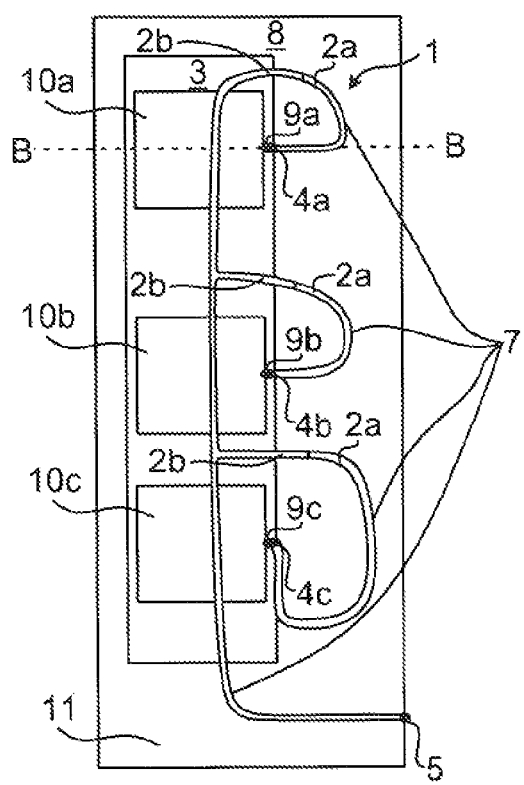
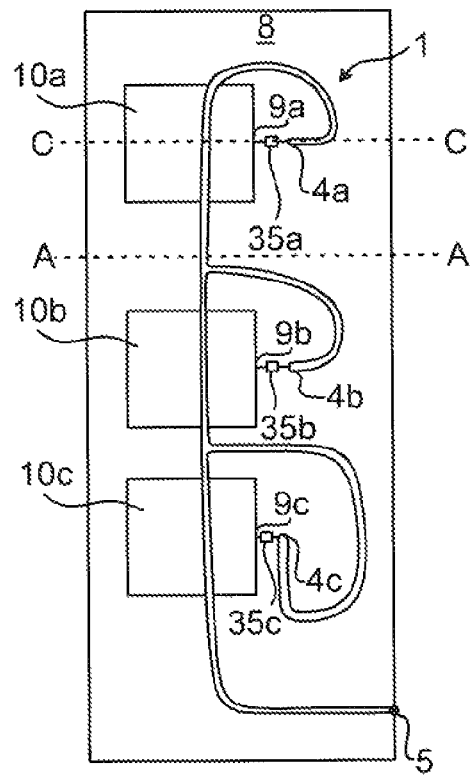
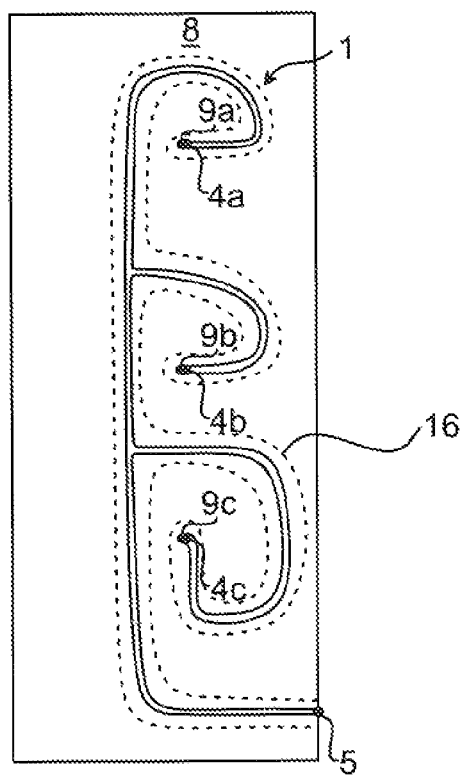
Fig. 2A
Fig. 2B
Fig. 2C

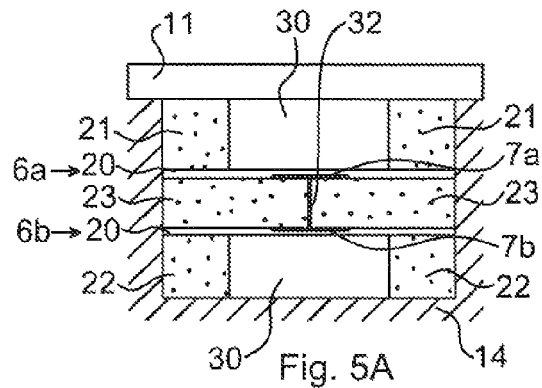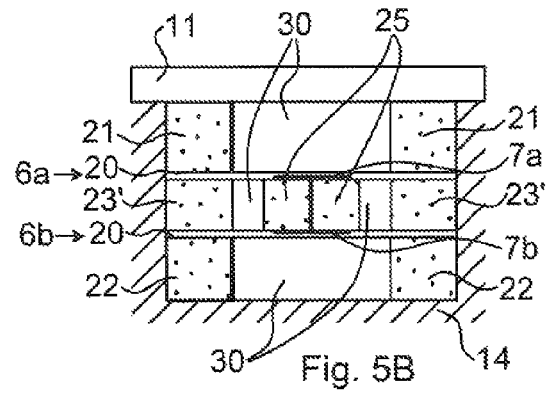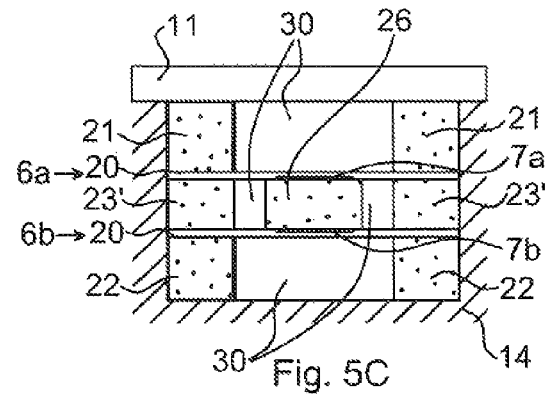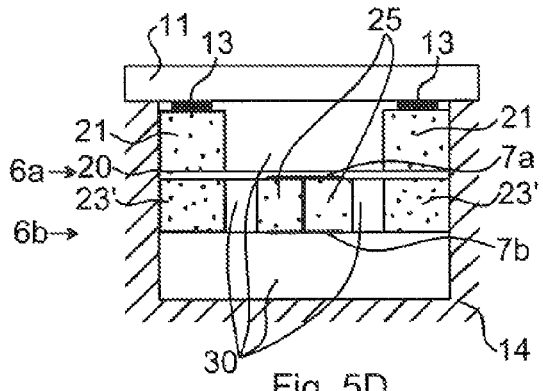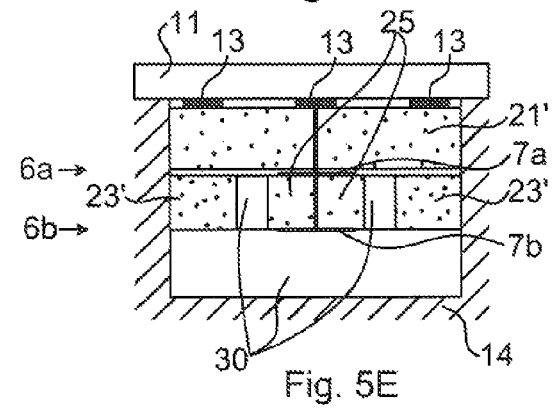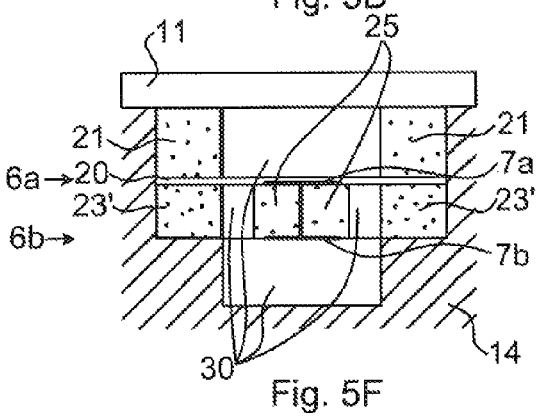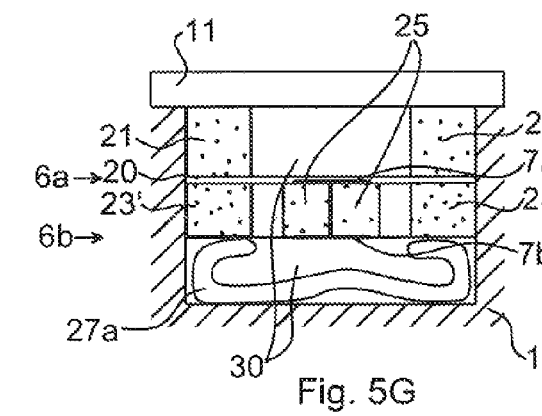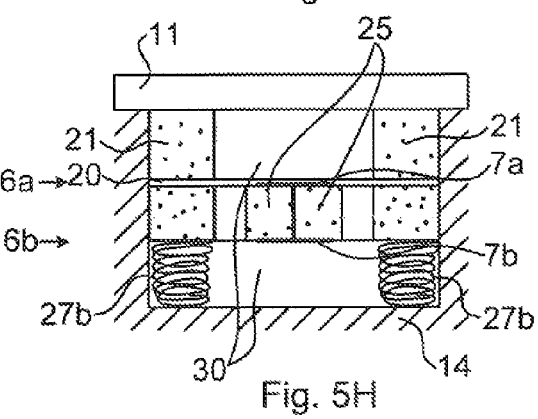

POWER AMPLIFIER ASSEMBLY COMPRISING SUSPENDED STRIP LINES

CROSS REFERENCE TO RELATED APPLICATION(S)

This application is a 35 U.S.C. §371 National Phase Entry Application from PCT/SE2011/050698, filed Jun. 7, 2011, designating the United States, the disclosure of which is incorporated herein in its entirety by reference.

TECHNICAL FIELD

The present invention relates to a power amplifier assembly comprising a radio frequency multi-order power amplifier.

BACKGROUND

Transmitters in many radio-based telecommunications and broadcast systems are designed to transmit wide bandwidth modulated signals with the great power efficiency. Generally, components and signal tracks of the final parts of the radio signal chain contributes significantly to the DC (Direct Current) power consumption.

A typical final amplification stage of the transmitter is made in multilayer microstrip/stripline-type printed circuit board (PCB) technology and contains an output matching network, a directional coupler and an isolator/circulator. The directional coupler picks up a small part of the transmitted signal back to a linearization/predistortion block. Microstrip transmission lines, surface mounted directional coupler and the isolator contribute to a loss of the transmitted signal and lower overall efficiency of the transmitter. All features added after the final transmitter power amplifiers are especially costly, since any insertion loss at this point has great effect on the efficiency of the transmitter. This typically implies that the final amplification stages, and especially the power amplifier, compensate by delivering a higher output power than ideally would be needed. These losses reduce the performance of the system and can increase size due to space demanding physical cooling solutions.

Efficiency enhancement techniques often involve a multi order configuration of power amplifiers (MOPA) as presented in WO 01/95481. Here, a multistage Doherty amplifier is provided. The presented system uses separate drive amplifiers for individual power amplifiers and/or groups of power amplifiers. This makes it possible to make improve efficiency and linearity by optimizing the drive for the different power amplifiers and using less drive power. Prior art solutions such as this improve upon DC/DC power consumed in the power amplifier, but may need large areas of combining networks at the output which also contributes to the loss after the power amplifier, and consequently decreases overall efficiency.

A suspended line, made of a thick metal plate and supported with quartz slabs, has been applied in high performance HEMT (High Electron Mobility Transistor) amplifier described in: R. Peter, M. V. Schneider, Y. S. Wu, High-Performance HEMT Amplifiers with a Simple Low-Loss Matching Network, IEEE Transactions on Microwave Theory and Techniques, vol. 39, No. 9, pp. 1673-1675. However, such a solution can be used only as a separate module because it is hard to integrate it with the standard PCB technology.

U.S. Pat. No. 5,896,065 presents a radially combined RF (Radio Frequency) amplifier including an input divider for dividing the input power signal into "N" input signals, and a single matching circuit configuration for matching an combining the amplified "N" input signals into one combined output power signal. The system utilizes a stripline configuration of the matching circuitry and suspends this circuitry above one surface of an aluminum chill plate. The input stage of the amplifier is disposed on the opposite surface of the chill plate with the transistors connecting the input stage with the output network across the peripheral edge of the chill plate. However, the combiner circuit is provided in a fragile structure and mechanical and electrical control of the suspended circuitry is limited.

SUMMARY

It is an object to obviate at least some of the above disadvantages.

According to a first aspect, it is presented a power amplifier assembly comprising: a radio frequency multi-order power amplifier comprising a circuit board; a grounding structure connected to the radio frequency multi-order power amplifier and comprising a recess; a combining network connected to a plurality of outputs of the radio frequency multi-order power amplifier. The combining network comprises: a plurality of input connection points, wherein each of the plurality of input connection points is connected to a respective output of the plurality of outputs of the radio frequency multi-order power amplifier; an output connection point; and a conductor arrangement comprising a plurality of conductive paths arranged between the plurality of input connection points and the output connection point; wherein at least one of the plurality of conductive paths is at least partly formed by a suspended conductor positioned in the recess of the grounding structure.

By positioning the conductor arrangement in the recess, several advantages are achieved. Firstly, impedance is more predictable, whereby the control of the impedance increased. Secondly, electrical and mechanical isolation between various parts of the circuitry, such as the amplifier branches, is improved. It is to be noted that the phrase 'suspended conductor' is also denoted 'suspended line' and the two terms can be exchanged for each other.

Each of the plurality of conductive paths may be at least partly formed by a respective suspended conductor positioned in the recess of the grounding structure.

The recess of the grounding structure may face the circuit board. In this way, the suspended conductors are essentially surrounded by the circuit board and the grounding structure. This surrounding grounding around the suspended conductors reduces susceptibility to electromagnetic interference and also reducing losses.

The suspended conductors may be air-dielectric conductors, printed on a dielectric sheet, suspended using foam material or suspended in any other way.

The power amplifier assembly may further comprise a plurality of capacitors respectively provided between the plurality of input connection points and the plurality of outputs of the radio frequency multi-order power amplifier. These capacitors provide DC blocking between the amplifier and the combining network.

A first section of the conductor arrangement may be arranged in a first layer and second section of the conductor arrangement may be arranged in a second layer.

The first section of the conductor arrangement may be in galvanic contact with the plurality of input connection points; the second section of the conductor arrangement may be in galvanic contact with the output connection point; and there may be an overlap between the first section and the second section to provide an electromagnetic coupling between the first section and the second section. This makes the conductor arrangement provide DC blocking as part of within its structure, eliminating the need for capacitors for DC blocking, which reduces cost.

The combining network may be mounted to the circuit board of the radio frequency multi-order power amplifier using solder pads.

The conductor arrangement may be mounted on a dielectric layer spaced from the circuit board of the radio frequency power amplifier by a first dielectric spacer.

The conductor arrangement may be mounted on a dielectric layer spaced from the circuit board of the radio frequency power amplifier by a first dielectric spacer and spaced from the grounding structure by a second dielectric spacer. The grounding structure may also function as a heat sink.

The conductor arrangement may be mounted on a dielectric layer spaced from the circuit board of the radio frequency power amplifier by a first dielectric spacer and spaced from the grounding structure using a biasing member biasing the dielectric layer towards the circuit board of the radio frequency power amplifier.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIGS. 2A-C are schematic diagrams showing various aspects of embodiments of a multi-order power amplifier and a combining network;

FIGS. 5A-H are cross sectional views of embodiments of how to implement the suspended line of FIGS. 2A-C.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
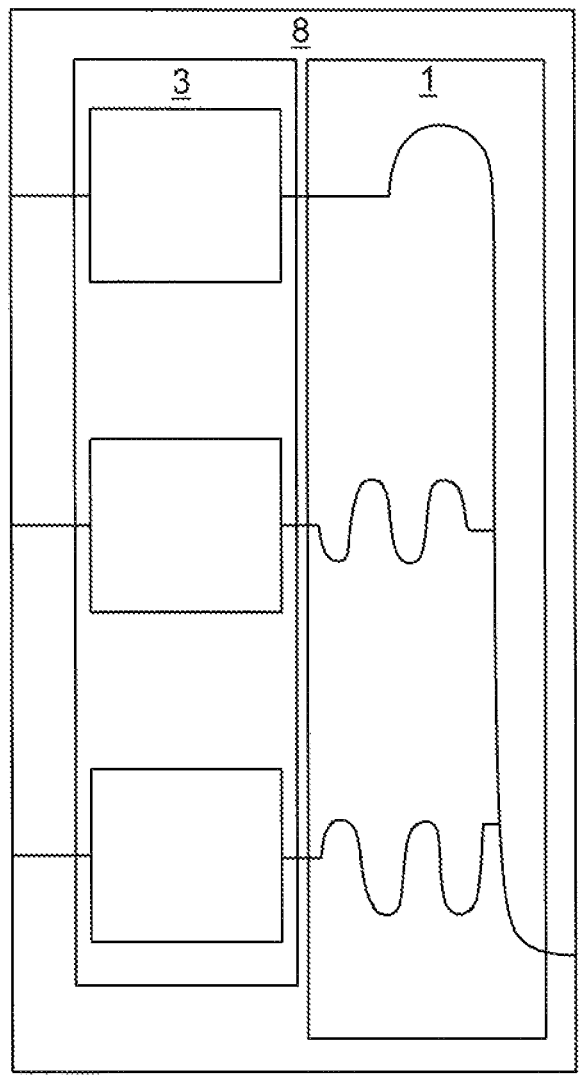
FIG. 1 is a schematic diagram showing a multi-order power amplifier and combining network according to the prior art.

FIG. 1 is a schematic diagram showing a multi-order power amplifier and combining network according to the prior art. A radio frequency (RF) multi-order power amplifier 3 has several outputs corresponding to the number of drive amplifiers. A combining network 1 is connected to the outputs and combines the outputs from the individual drive amplifiers to a single output which can be fed to an antenna. The power amplifier 3 and the combining network 1 are here collectively called a power amplifier assembly 8.

FIG. 2A is a schematic diagram showing an RF multi-order power amplifier 3 and combining network 1 according to one embodiment. The RF multi-order power amplifier 3 and a combining network 1 are collectively known as the power amplifier assembly 8. The power amplifier assembly 8 can for example be used as part of a transmitter for transmission of any signals in the radio frequency domain, such as signals for mobile communication, terrestrial television cable television, satellite television, satellite communication etc.

In this example, the RF multi-order power amplifier comprises three individual drive amplifiers 10a-c. However, any number of drive amplifiers can be used, as long as there are at least two. Each drive amplifier 10a-c has a respective output 9a-c, connected to respective input connection points 4a-c of the combining network 1. It is to be noted that while the outputs 9a-c of the RF multi-order power amplifier 3 and the input connection points 4a-c of the combining network here are disclosed as separate physical points, these can be co-located or even only abstract points between the power amplifier and respective arms of the combining network 1.

The combining network 1 comprises a conductor arrangement 7 between the input connection points and an output connection point 5, combining the signals output from the drive amplifiers 10a-c to the common output connection point 5. The conductor arrangement 7 has a conductive path, a majority of which is formed by suspended conductors, as will be explained in more detail below.

Furthermore, the bulk of the combining network 1 is in different plane from the RF multi-order power amplifier 3. In other words, conductor arrangement 7 is formed in another plane from conductors of any circuit boards on which the drive amplifiers 10a-c are mounted.

This arrangement has several advantages. A first advantage is that by placing the combining network 1 in a different plane from the circuit board 11, space is made available on the circuit board 11, which reduces restrictions when designing the circuit board 11.

A second advantage is lower losses. This is due to, being in a different plane than the circuit board 11, the construction allows the use of suspended lines for the conductor arrangement. Suspended lines have a dielectric constant close to 1, which is significantly lower than dielectric constants of microstrip conductors of circuit boards. Due to lower dielectric losses, the insertion loss of the combining network 1 is lower than if the combining network 1 were to be arranged on the circuit board 11 as in the prior art. Hence there is a reduction of RF loss after the last amplifier stage, reducing power consumption.

A third advantage is flexibility. Since combining network 1 is more frequency specific than other layout feature on a typical radio board, arranging the combining network away from the circuit board 11 opens up the possibility for circuit board layout reuse between frequency bands, whereby the layout of the combining network 1 is the main difference between power amplifier assemblies 8 of different frequencies.

A fourth advantage is that by placing the combining network 1 outside the circuit board 11 more cost effective materials can be used for the production of the combining network. This is due to the combining network 1 not requiring the use of special PCB materials for their function.

In FIG. 2B, capacitors 35a-c are respectively provided between the input connection points 4a-c and the outputs 9a-c of the radio frequency multi-order power amplifier 3.

Figure 3:
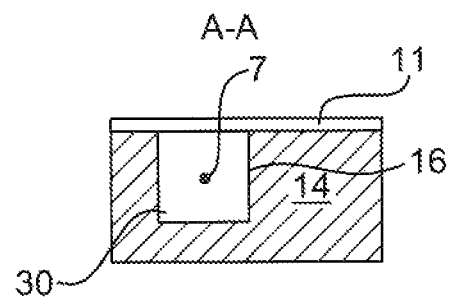
FIG. 3 is a cross sectional view along line A-A of FIG. 2B.

In FIG. 2C, it is shown a contour of a recess 16 in a grounding structure. Other components, such as the radio frequency (RF) multi-order power amplifier 3 are omitted in this drawing in order not to obscure the recess, but would still present in reality. The recess 16 is milled to follow the conductor arrangement 7, allowing the conductors to be positioned within the milled recess 16, surrounded by the grounding structure and the circuit board, as shown in FIG. 3. The recess is provided regardless of how DC blocking is achieved and is thus applicable for what is shown in both FIGS. 2A and 2B above.

FIG. 3 is a cross sectional view along line A-A of FIG. 2B. Here, the nature of the suspended nature of the conductor arrangement 7 is more clearly visible. The conductive path of the conductor arrangement 7 here is spaced away from the circuit board 11 and a grounding structure 14. The grounding structure 14 can also function as a heat sink 14, being any suitable heat sink capable of transporting heat away from the power amplifier assembly 8, and can for instance be made of aluminium. The grounding structure 14 is grounded. The conductor arrangement 7 here is surrounded by free space 30 having a low dielectric constant. The free space 30 can be air or it can be other material with low dielectric constant such as foam material or a dielectric sheet. The conductor arrangement 7 is thus surrounded by the grounding structure 14 and the circuit board 11, with the free space 30 in between. This provides a structure functioning similar to a coaxial cable.

The free space 30 can be achieved by milling a recess 16 in the grounding structure 14 which can form part of a chassis. This recess 16 can be milled to follow the conductor arrangement 7 as shown in FIG. 2C.

By positioning the conductor arrangement in the recess, several advantages are achieved. Firstly, impedance is more predictable, whereby the control of the impedance increased. Secondly, mechanical and electrical isolation between various parts of the circuitry, such as the amplifier branches, is improved.

Figure 4A:
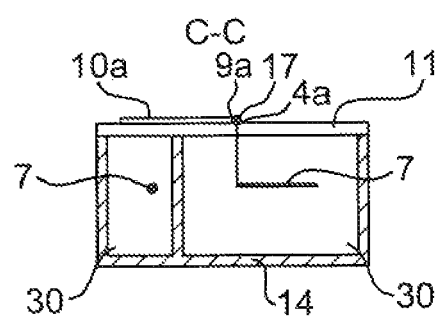
FIG. 4A is a cross sectional view along line C-C of FIG. 2B according to a first embodiment.

FIG. 4A is a cross sectional view along line C-C of FIG. 2B according to a first embodiment. Here the first drive amplifier 10a is shown as well as its output 9a. The corresponding input connection points 4a of the combining network 1 is also shown, with a galvanic connection to the conductor arrangement 7, as seen on the right in FIG. 4A. The conductor arrangement 7 loops around and is shown also on the left hand side of FIG. 4A. It is to be noted that the relative dimensions are not indicative of construction and the figure is only schematic. In this embodiment, a DC blocking device (not shown here), such as a capacitor, can be provided e.g. between the output 9a and the input connection point 4a.

Figure 4B:
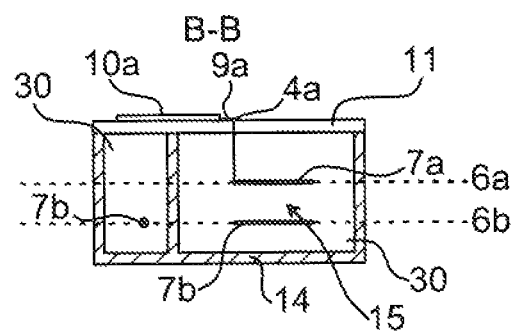
FIG. 4B is a cross sectional view along line B-B of FIG. 2A according to a second embodiment.

FIG. 4B is a cross sectional view along line B-B of FIG. 2A according to a second embodiment. The difference compared to FIG. 4A is that here, a first section 7a of the conductor arrangement 7 is arranged in a first layer 6a and a second section 7b is arranged in a second layer 6b. The distance between the first section 7a and the second section 7b is sufficiently short to provide sufficient electromagnetic coupling between the two sections. A further effect of this arrangement is that there is a DC block between the two sections, while still allowing RF signals to pass. This eliminates the need for a specific DC block device between the output of the drive amplifiers 10a-c and the combining network 1.

With combined reference to FIGS. 2A and 4B, the conductor arrangement 7 can be divided in a DC block part 2a and a main part 2b, where the DC block part 2a is arranged as shown in FIG. 4B. The DC block part 2a can be provided at a part of the conductor arrangement 7 which is closest to the input connection points 4a. Both the DC block part 2a and the main part 2b of the conductor arrangement 7 can have first and second sections 7a-b arranged in two layers 6a-b, but the first section 7a of the DC block part 2a and the main part 2b are galvanically isolated. In this way, the first section 7a and the second section 7b of the main part 2b can be galvanically connected with conductors, e.g. as presented in FIGS. 5A-B and 5D-H below. By connecting the first and second sections 7a-b in the main part 2b, insertion loss of the combining network 1 is reduced.

FIGS. 5a-h are cross sectional views of embodiments of how to implement the suspended line of FIG. 2.

In FIG. 5a, disclosing a main part 2b of the conductor arrangement 7, it is shown dielectric layers 20, 21, 22, and 23. In one embodiment, the layer 20 can consist of a prepreg or bonding material in the peripheral area between the core dielectric layers 21, 22, 23, and a dielectric layer in the centre area. A solder mask can be provided over the conductors. The prepreg or bonding material does not need to be the same thickness as the solder mask. In another embodiment, the layer 20 can consist of a single dielectric layer.

The middle dielectric layer 23 is the main dielectric layer supporting printed conductors of first and second sections 7a-b of respective layers 6a-b. The upper and lower dielectric layers 21-22 support the middle dielectric layer 23 in the milled recess of the grounding structure 14. The conductors of the first and second sections 7a-b can be provided on one or two sides of the middle dielectric layer 23. If double-sided, they can be connected by via holes 32 outside any DC blocking area, such as area 2a of FIG. 2A. Optionally, since RF currents tends to flow at edges, pairs of via holes can be supplied at the edges of the conductors 7a-b. To reduce dielectric losses of the suspended transmission line, a significant amount of free space 30 is thus provided.

The structure shown in FIG. 5B is the same as FIG. 5A, with the exception that more free space 30 between a horizontally centred portion 25 of the middle layer and outer portions 23' of the middle layer. This provides even lower dielectric losses.

FIG. 5C shows the same structure as in FIG. 5B but in a block part where there is no conductor connecting the first and second sections 7a-b.

FIG. 5D shows the same structure as in FIG. 5B, but without the lower dielectric layer 22. This provides more free space 30, at the cost of requiring a structure of the remaining dielectric layers 20, 21, 21 to keep the first and second sections 7a-b in place. This can for example be implemented with fasteners 13, bonding the upper dielectric layer 21 to the main circuit board 11, e.g. by soldering.

FIG. 5E shows a structure where the first section 7a is soldered to the circuit board 11. Additional dielectric material 21' is provided, to support a connection between the first section 7a and the circuit board 11, using a solder pad of the input connection point 4.

FIG. 5F shows the same structure as in FIG. 5B, but instead of the lower dielectric layer 22, a dual width structure of the recess provides necessary mechanical support.

FIG. 5G shows the same structure as in FIG. 5B, but instead of the lower dielectric layer 22, a mechanical resilient support 27a is provided. FIG. 5H shows the same structure as in FIG. 5G, but here the mechanical resilient support 27b are implemented using springs. Using a resilient mechanical support reduces the tolerance requirement in sizes of the dielectric layers 21, 23' since these are biased upwards by the resilient mechanical support.

Optionally, these mechanical supports can be provided only at specific points of the combining network, i.e. not along the entire length of the combining network.

FIGS. 5A and 5E show embodiments of sections where the suspended line is structurally supported. FIGS. 5B-D and 5F-H show embodiments of sections between structurally supported sections, where the first and second sections 7*a-b* of the suspended line are suspended, achieving the advantages of lowered dielectric constant as described above.

Figure 6A:
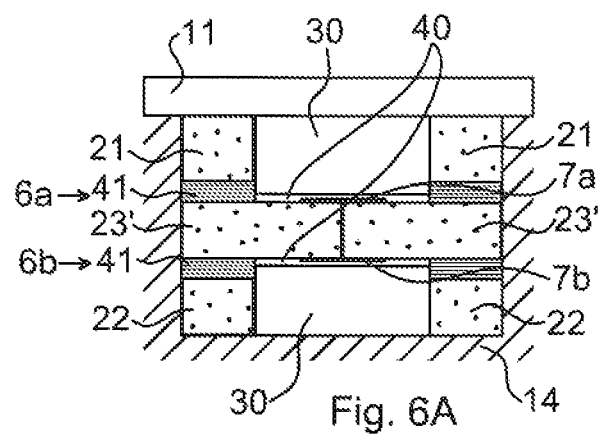
FIGS. 6A-B are further cross sectional views showing embodiments of the suspended line of FIGS. 2A-B.
Figure 6B:
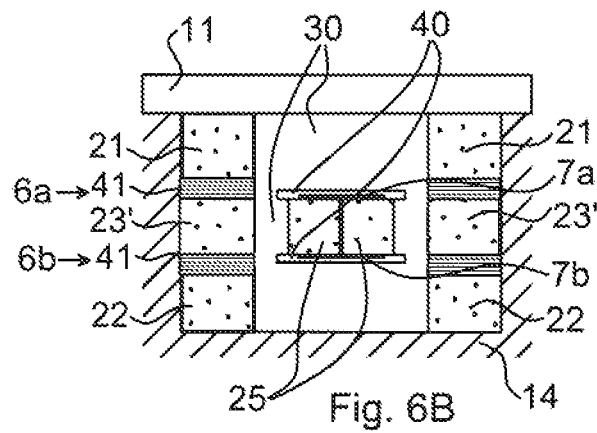

FIGS. 6A-B are further cross sectional views showing embodiments of the suspended line of FIGS. 2A-B. In FIG. 6A, a cross section is shown where support is provided for the first and second sections 7*a-b* of the suspended line. The dielectric material 23' here is solid for this purpose and is connected to the other dielectric layers 21, 22 via prepreg 41. The solder mask 40 is also shown here.

In FIG. 6B, compared to what is shown in FIG. 6A, a cavity 30 has been milled between the peripheral dielectrics and the centre section comprising the first and second sections 7*a-b* of the suspended line. In this way, the dielectric constant is reduced, providing the benefits of a suspended line described above.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A power amplifier assembly comprising:
   a radio frequency multi-order power amplifier comprising a circuit board;
   a grounding structure connected to the radio frequency multi-order power amplifier and comprising a recess, wherein the recess is formed by a continuous end wall and one or more pairs of opposing side walls of the grounding structure and the recess has an opening opposing the continuous end wall;
   a combining network connected to a plurality of outputs of the radio frequency multi-order power amplifier, the combining network comprising:
   a plurality of input connection points, wherein each of the plurality of input connection points is connected to a respective output of the plurality of outputs of the radio frequency multi-order power amplifier;
   an output connection point; and
   a conductor arrangement comprising a plurality of conductive paths arranged between the plurality of input connection points and the output connection point;
   wherein at least one of the plurality of conductive paths is at least partly formed by a suspended conductor positioned in the recess of the grounding structure.

2. The power amplifier assembly according to claim 1, wherein each of the plurality of conductive paths is at least partly formed by a respective suspended conductor positioned in the recess of the grounding structure.

3. The power amplifier assembly according to claim 1, wherein the recess of the grounding structure faces the circuit board.

4. The power amplifier assembly according to claim 1, wherein the suspended conductors are air-dielectric conductors, printed on a dielectric sheet or suspended using foam material.

5. The power amplifier assembly according to claim 1, further comprising a plurality of capacitors respectively provided between the plurality of input connection points and the plurality of outputs of the radio frequency multi-order power amplifier.

6. The power amplifier assembly according to claim 1, wherein a first section of the conductor arrangement is arranged in a first layer and a second section of the conductor arrangement is arranged in a second layer.

7. The power amplifier assembly according to claim 6, wherein:
   the first section of the conductor arrangement is in galvanic contact with the plurality of input connection points;
   the second section of the conductor arrangement is in galvanic contact with the output connection point; and
   there is an overlap between the first section and the second section to provide an electromagnetic coupling between the first section and the second section.

8. The power amplifier assembly according to claim 1, wherein the combining network is mounted to the circuit board of the radio frequency multi-order power amplifier using solder pads.

9. The power amplifier assembly according to claim 1, wherein the conductor arrangement is mounted on a dielectric layer spaced from the circuit board of the radio frequency power amplifier by a first dielectric spacer.

10. The power amplifier assembly according to claim 1, wherein the conductor arrangement is mounted on a dielectric layer spaced from the circuit board of the radio frequency power amplifier by a first dielectric spacer and spaced from the grounding structure by a second dielectric spacer.

11. The power amplifier assembly according to claim 1, wherein the conductor arrangement is mounted on a dielectric layer spaced from the circuit board of the radio frequency power amplifier by a first dielectric spacer and spaced from the grounding structure using a biasing member biasing the dielectric layer towards the circuit board of the radio frequency power amplifier.

* * * * *